United States Patent
White

(10) Patent No.: US 7,463,075 B2
(45) Date of Patent: Dec. 9, 2008

(54) METHOD AND DELAY CIRCUIT WITH ACCURATELY CONTROLLED DUTY CYCLE

(75) Inventor: Robert L. White, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 112 days.

(21) Appl. No.: 11/473,637

(22) Filed: Jun. 23, 2006

(65) Prior Publication Data

US 2007/0296477 A1 Dec. 27, 2007

(51) Int. Cl.
*H03K 3/017* (2006.01)

(52) U.S. Cl. ........................ 327/175; 327/172

(58) Field of Classification Search ......... 327/172–176, 327/165, 166
See application file for complete search history.

(56) References Cited

U.S. PATENT DOCUMENTS

| | | | | |
|---|---|---|---|---|
| 5,907,254 A * | 5/1999 | Chang | ........................ | 327/165 |
| 6,111,680 A * | 8/2000 | Harvey | ........................ | 398/183 |
| 6,181,178 B1 * | 1/2001 | Choi | ........................... | 327/175 |
| 6,198,322 B1 * | 3/2001 | Yoshimura | ................... | 327/175 |
| 6,320,438 B1 * | 11/2001 | Arcus | ........................ | 327/175 |
| 6,781,419 B2 * | 8/2004 | Harrison | ...................... | 326/95 |
| 7,148,731 B2 * | 12/2006 | Minzoni | ..................... | 327/175 |
| 7,199,632 B2 * | 4/2007 | Chun et al. | .................. | 327/172 |
| 7,202,720 B2 * | 4/2007 | Kim | ........................... | 327/158 |
| 7,271,635 B2 * | 9/2007 | Baker et al. | ................. | 327/175 |
| 2003/0094984 A1 | 5/2003 | Weis et al. | | |

* cited by examiner

*Primary Examiner*—Lincoln Donovan
*Assistant Examiner*—Hai L. Nguyen
(74) *Attorney, Agent, or Firm*—Mirna Abyad; Wade James Brady, III; Frederick J. Telecky, Jr.

(57) ABSTRACT

A delay locked loop includes a storage element coupled to a data bus and produces a data synchronization signal. A phase detector receives a data clock signal and the data synchronization signal and produces a delay control signal. A first delay circuit produces a signal which is delayed relative to the data clock signal according to the delay control signal. A second delay circuit receiving the delayed signal produces a control signal coupled to a control input of the storage element by delaying the delayed signal an amount which causes the control signal to have a predetermined duty cycle.

19 Claims, 3 Drawing Sheets

METHOD AND DELAY CIRCUIT WITH ACCURATELY CONTROLLED DUTY CYCLE

BACKGROUND OF THE INVENTION

The present invention relates generally to optimal use of delay circuits clocked by "double data rate" clock signals, and more particularly to systems including circuitry capable of generating double data rate clock signals that optimally clock data into and out of such delay circuits. The invention also relates to circuitry for automatically correcting duty cycles of clock signals to predetermined duty cycle values.

Double data rate clock signals are used to clock data into and out of a circuit, such as a register, on both the rising edges and the falling edges of the double data rate clock signals, allowing the use of a clock frequency that is one half of the data rate, and therefore allows doubling the effective bandwidth of the system. It usually is important that the duty cycle of high frequency (e.g., several gigahertz) double data rate clock signals be precisely 50%, because otherwise, the amounts of time available to accomplish the timing of the clocking or strobing of the data are asymmetrical for the rising and falling edges of the clock. That may cause various kinds of problems, including asymmetrical noise margins in the timing of various associated digital data signals, which is generally undesirable in very high speed (e.g. several gigahertz) applications wherein all aspects of the data signal timing accuracy may be critical.

For example, asymmetric double data rate clock signals cause higher data error rates in the digital signal being clocked and limit the maximum speed of the system clock signal. Because of the usual parameter variations in the inverters of a delay circuit, any variation from the optimum 50% duty cycle of a double data rate clock signal, wherein the data is latched on both the rising and falling edges of the double data rate clock signal, is likely to cause an even greater error rate of the data being clocked through the delay circuit. Therefore, "loose" control of the duty cycle of a "double data rate" clock usually is not acceptable at high frequencies.

"Prior Art" FIG. 1A shows a typical delay locked loop circuit 1 which includes a transmit register 3 that receives the input data signal DATA via multiconductor input bus 2. The signal DATA is clocked into transmit register 3 every data time frame by a transmit clock DLYCLK. That results in the signal DATA IN appearing on a multi-conductor bus 4 at the data input of a receive register 6 a fixed amount of delay time after the rising or falling edge of transmit clock DLYCLK. The fixed amount of delay time is equal to the sum of an intrinsic delay through transmit register 3 plus the signal propagation time along bus 4 from the data output of transmit register 3 to the data input of receive register 6, plus the set-up time of receive register 6. Data that has been clocked into receive register 6 by data clock DCLK appears as DATA OUT on multiconductor bus 5.

DATA IN bus 4 includes a synchronization conductor 4A having the same average total propagation delay as the other conductors of multi-conductor bus 4. Synchronization conductor 4A conducts a synchronization signal DATA SYNC.

Synchronization conductor 4A provides the synchronization signal DATA SYNC to one input of an exclusive OR gate 9, which functions as a phase detector. The other input of exclusive OR gate 9 receives the data clock signal DCLK which is also coupled by conductor 8 to the clock input 6A of receive register 6. Exclusive OR gate 9 produces an output signal DELAY CONTROL on conductor 10, which is connected to a control input of an adjustable delay circuit 11. Adjustable delay circuit 11 produces a delayed data clock signal DLYCLK on conductor 12. The delayed data clock signal DLYCLK produced by adjustable delay circuit 11 is coupled by conductor 12 to the clock input 3A of transmit register 3 to function as its transmit clock.

Data clock signal DCLK and delayed data clock signal DLYCLK serve as double data rate clock signals as shown in FIG. 1B and require a 50% duty cycle. The various "1"s and "0"s of the input data signal DATA on bus 2 are clocked into transmit register 3 by the rising edge A of DLYCLK as shown in the timing diagram of FIG. 1B and then appear on multiconductor bus 4 at the beginning of frame 17 of DATA SYNC on synchronization conductor 4A. During falling edge B of DLYCLK, the various "1"s and "0"s of DATA on bus 2 are clocked into transmit register 3 and then appear on multiconductor bus 4 at the beginning of frame 18 of DATA SYNC on synchronization conductor 4A. Similarly, the various "1"s and "0"s of DATA IN on multiconductor bus 4 are clocked into receive register 6 by the rising edge C of data clock DCLK and then appear as DATA OUT on output bus 5, and during falling edge D of DCLK the various "1"s and "0"s of DATA IN on multiconductor bus 4 are clocked into receive register 6 and then also appear as DATA OUT on output bus 5.

The feedback of the delay locked loop formed of exclusive OR gate 9, adjustable delay circuit 11, and transmit register 3 forces the edges of DLYCLK to be in quadrature phase locked relationship with the DATA SYNC signal. The rising and falling edges of clock signal DCLK on conductor 8 clock successive bits of DATA IN bus 4 into receive register 6. In order to compensate for various delays associated with transmit register 3 and multiconductor bus 4 and also the set-up time of receive register 6, the delay locked loop adjusts the delay between DCLK and DLYCLK until DCLK and synchronization signal DATA SYNC on conductor 4A are in "quadrature", i.e. 90 degrees out of phase as shown in the timing diagram of FIG. 1B.

However, this operation does not ensure a 50% duty cycle of DLYCLK, which functions as the transmit clock of transmit register 3.

Although the data rates of the foregoing signals could be achieved by providing a clock that has twice the frequency of the signals DATA IN and DCLK and by latching DATA IN only on the rising edge of DCLK, that would double the bandwidth of the system, which in some cases would be impractical or disadvantageous.

Thus, there is an unmet need for a double data rate clock signal having a duty cycle that is not sensitive to changes in integrated circuit process parameters and temperature.

There also is an unmet need for a circuit and technique which can be used to automatically correct the duty cycle of high speed signals, including double data rate clock signals.

There also is an unmet need for a circuit and technique for providing the capability of generating a signal having an arbitrary fixed duty cycle.

SUMMARY OF THE INVENTION

It is an object of the present invention to provide a double data rate clock signal having a duty cycle that is not sensitive to changes in integrated circuit process parameters and temperatures.

It is another object of the invention to provide a circuit and technique which can be used to automatically correct the duty cycle signals, including double data rate clock signals.

It is another object of the invention to provide a circuit and technique for providing a signal having the capability of generating an arbitrary fixed duty cycle.

Briefly described, and in accordance with one embodiment, the present invention provides a delay locked loop that includes a storage element (3) coupled to a data bus (4) and produces a data synchronization signal (DATA SYNC). A phase detector (9) receives a data clock signal (DCLK) and the data synchronization signal and produces a delay control signal (DELAY CONTROL). A first delay circuit (11) produces a signal (DLYCLK) which is delayed relative to the data clock signal according to the delay control signal. A second delay circuit (20) receiving the delayed signal produces a control signal (TRCLK) coupled to a control input of the storage element by delaying the delayed signal (DLYCLK) an amount which causes the control signal (TRCLK) to have a predetermined duty cycle.

In one embodiment, circuitry for establishing and automatically maintaining a predetermined duty cycle of a control signal (TRCLK) includes a first storage element (3) having a data input (2), a control input (3A), a data output coupled to a first data bus (4), the first data bus (4), and a synchronization conductor (4A) conducting a data synchronization signal (DATA SYNC) that is synchronized with data (DATA IN) on the first data bus (4). A phase detector (9) has a first input coupled to receive a data clock signal (DCLK) and a second input coupled to the synchronization conductor (4A) to receive the data synchronization signal (DATA SYNC). The phase detector (9) produces a delay control signal (DELAY CONTROL) having a value indicative of a phase difference between the data clock signal (DCLK) and the data synchronization signal (DATA SYNC). A first delay circuit (11) produces a first delayed signal (DLYCLK) which is delayed relative to the data clock signal (DCLK) by an amount corresponding to a value of the delay control signal (DELAY CONTROL). A second delay circuit (20) has an input receiving the first delayed signal (DLYCLK) and also having an output (12A) coupled to the control input (3A) of the first storage element (3) and produces the control signal (TRCLK) by delaying the first delayed signal (DLYCLK) an amount which causes the control signal (TRCLK) to have a predetermined duty cycle.

In the described embodiment, the control signal (TRCLK) is a double data rate signal which clocks successive bits of data into the first storage element (3) in response to rising edges and in response to falling edges, respectively, of the control signal (TRCLK). The data clock signal (DCLK) and the data synchronization signal (DATA SYNC) also are double data rate signals.

In the described embodiment, the phase detector (9) operates to determine when the data clock signal (DCLK) and the data synchronization signal (DATA SYNC) are at different logic levels. The phase detector (9) includes an exclusive ORing circuit which produces the delay control signal (DELAY CONTROL) as a first logic level if the data clock signal (DCLK) and the data synchronization signal (DATA SYNC) are at different logic levels and produces the delay control signal (DELAY CONTROL) as a second logic level if the data clock signal (DCLK) and the data synchronization signal (DATA SYNC) are at the same logic level. The first data bus (4) is a parallel data bus and wherein a sufficient portion of the synchronization conductor (4A) is physically grouped with other conductors of the first data bus (4) to ensure that the data synchronization signal (DATA SYNC) is precisely synchronized with the data (DATA IN) appearing at the input of a second storage element (6).

In the described embodiment, the second delay circuit (20) introduces a delay which causes a delay locked loop including the phase detector (9), the first delay circuit (11), the second delay circuit (20), and the first storage element (3) to cause the control signal (TRCLK) to have a 50% duty cycle. The second delay circuit (20) includes a third delay circuit (21) having a first input (12) coupled to receive the first delayed signal (DLYCLK), a second input (23), and an output coupled to the output (12A) of the second delay circuit (20), a filter (25) coupled to filter the control signal (TRCLK) and produce an output signal which represents an average value of the control signal (TRCLK), and an operational amplifier (27) having a first input coupled to receive the average value of the control signal (TRCLK), a reference voltage circuit (31, 32) producing a reference voltage (Vref) on a second input of the operational amplifier (27), an output of the operational amplifier (27) producing a duty cycle control signal (DTYCTRL) on the second input (23) of the third delay circuit (21).

In the described embodiment, the third delay circuit (21) includes current starved inverter circuitry (41, 42) that charges and discharges a capacitance (C3) to produce a sawtooth signal (46) having positive-going and negative-going half-cycles from which the control signal (TRCLK) is derived, and also includes circuitry responsive to the duty cycle control signal (DTYCTRL) to adjust current supplied to the current starved inverter so as to adjust the charging rate of the capacitance (C3) and thereby correspondingly adjust the duty cycle of the control signal (TRCLK) in response to the duty cycle control signal (DTYCTRL). A delay locked loop adjusts the delay of the first delayed signal (DLYCLK) to achieve a condition wherein amounts of time that the logic levels of the data synchronization signal (DATA SYNC) and the data clock signal (DCLK) are equal is precisely equal to amounts of time that the logic levels of the data synchronization signal (DATA SYNC) and the data clock signal (DCLK) are opposite.

In one embodiment, the invention provides a method of establishing and automatically maintaining a predetermined duty cycle of a control signal (TRCLK) by applying data (DATA) to an input (2) of a first storage element (3) having a control input (3A) and a data output coupled to a first data bus (4) and producing a data synchronization signal (DATA SYNC) that is synchronized with data (DATA IN) being produced on the first data bus (4), providing a data clock signal (DCLK) on a first input of a phase detector circuit (9) and applying the data synchronization signal (DATA SYNC) to a second input of the phase detector (9) and operating the phase detector (9) to produce a delay control signal (DELAY CONTROL) having a value indicative of a phase difference between the data clock signal (DCLK) and the data synchronization signal (DATA SYNC), producing the control signal (TRCLK) by delaying the first delayed signal (DLYCLK) an amount which causes the control signal (TRCLK) to have a predetermined duty cycle, and applying the control signal (TRCLK) to the control input (3A) of the first storage element (3) to cause it to reproduce the data (DATA) on the first data bus (4) in synchronization with the data clock signal (DCLK).

In one embodiment, the invention provides circuitry for establishing and automatically maintaining a predetermined duty cycle of a control signal (TRCLK), including means for applying data (DATA) to an input (2) of a first storage element (3) having a control input (3A) and a data output coupled to a first data bus (4) and producing a data synchronization signal (DATA SYNC) that is synchronized with data (DATA IN) being produced on the first data bus (4), means for providing a data clock signal (DCLK) on a first input of a phase detector circuit (9) and applying the data synchronization signal (DATA SYNC) to a second input of the phase detector (9) and operating the phase detector (9) to produce a delay control signal (DELAY CONTROL) having a value indicative of a phase difference between the data clock signal (DCLK) and the data synchronization signal (DATA SYNC), means for producing the control signal (TRCLK) by delaying the first delayed signal (DLYCLK) an amount which causes the control signal (TRCLK) to have a predetermined duty cycle, and means for applying the control signal (TRCLK) to the control input (3A) of the first storage element (3) to cause it to reproduce the data (DATA) on the first data bus (4) in synchronization with the data clock signal (DCLK).

DETAILED DESCRIPTION OF THE PREFERRED EMBODIMENTS

Figure 2A:
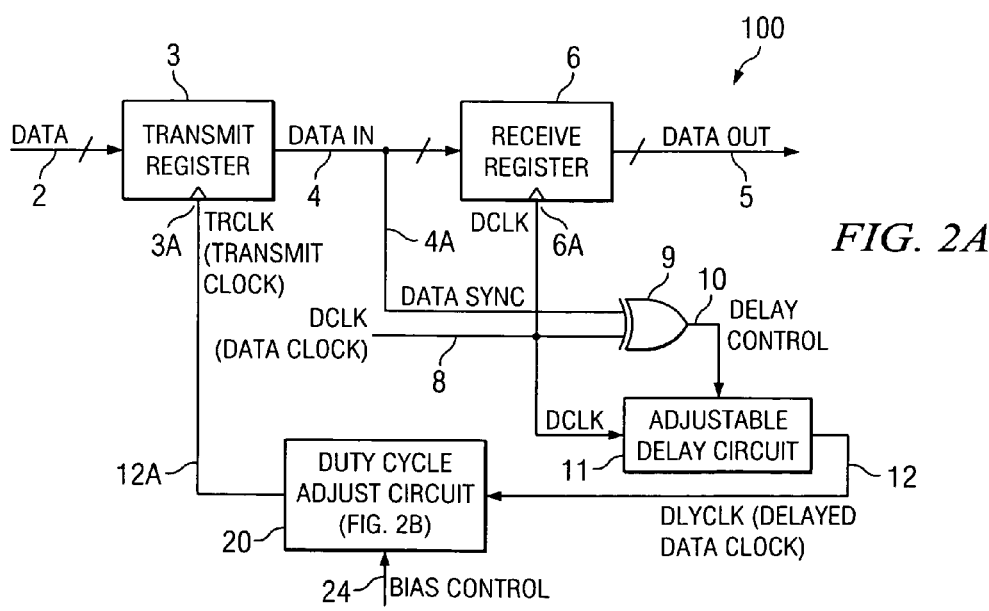
FIG. 2A is a block diagram of the system shown in FIG. 1A further including a duty cycle adjust circuit in accordance with the present invention.

FIG. 2A shows a typical delay locked loop circuit 100 which includes transmit register 3 receiving the input data signal DATA via multiconductor input bus 2. The signal DATA is clocked into transmit register 3 every data time frame by a transmit clock TRCLK. That results in the signal DATA IN appearing on multi-conductor bus 4 at the data input of receive register 6 a fixed amount of delay time after the rising or falling edge of transmit clock TRCLK. The fixed amount of delay time is equal to the sum of the intrinsic delay through transmit register 3 plus the signal propagation time along bus 4 from the data output of transmit register 3 to the data input of receive register 6, plus the set-up time of receive register 6. Data that has been clocked into receive register 6 by data clock DCLK appears as DATA OUT on multiconductor bus 5.

DATA IN bus 4 includes synchronization conductor 4A having precisely the same average total propagation delay as the other conductors of multi-conductor bus 4. Synchronization conductor 4A provides synchronization signal DATA SYNC to one input of exclusive OR gate 9, which functions as a phase detector. The other input of exclusive OR gate 9 receives data clock signal DCLK which is also connected by conductor 8 to the clock input 6A of receive register 6. Exclusive OR gate 9 produces output signal DELAY CONTROL on conductor 10, which is connected to the control input of adjustable delay circuit 11. (By way of definition, an exclusive OR circuit and an exclusive NOR circuit both are considered to perform an "exclusive ORing" function.)

In effect, the amount of time that the logic levels of DATA SYNC and DCLK are different is determined by exclusive OR gate 9 in order to produce DELAY CONTROL on conductor 10. Adjustable delay circuit 11 produces a delayed data clock signal DLYCLK on conductor 12. That signal probably will not have a 50% duty cycle, due to various parasitic effects in adjustable delay circuit 11.

Figure 2B:
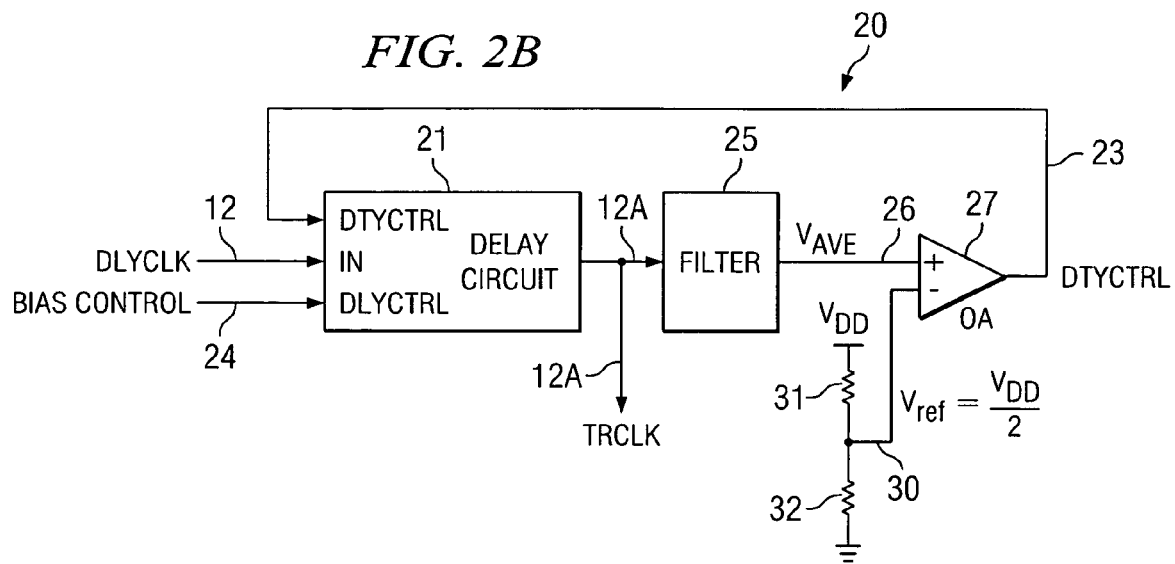
FIG. 2B is a block diagram of the closed loop duty cycle adjust circuit 20 in FIG. 2A.

The delayed data clock signal DLYCLK produced on conductor 12 by adjustable delay circuit 11 is, in accordance with the present invention, coupled to the input of a duty cycle adjust circuit 20 (shown in detail in FIG. 2B). Duty cycle adjust circuit 20 corrects the duty cycle to a predetermined value, for example, 50%. A bias control voltage 24 connected to duty cycle adjust circuit 20 establishes the bias current therein. Duty cycle adjust circuit 20 establishes a predetermined delay between its input signal DLYCLK on conductor 12 and its output signal TRCLK on conductor 12A. TRCLK is coupled to the clock input 3A of transmit register 3 and functions as its transmit clock. Thus, delay locked circuit 100 of FIG. 2A inserts duty cycle adjust circuit 20 between the output 12 of adjustable delay circuit 11 and the clock input 3A of transmit register 3. The duty cycle of TRCLK is adjusted by duty cycle adjust circuit 20 to a predetermined value, for example 50%, in the case of double data rate clock signals.

Figure 1A:
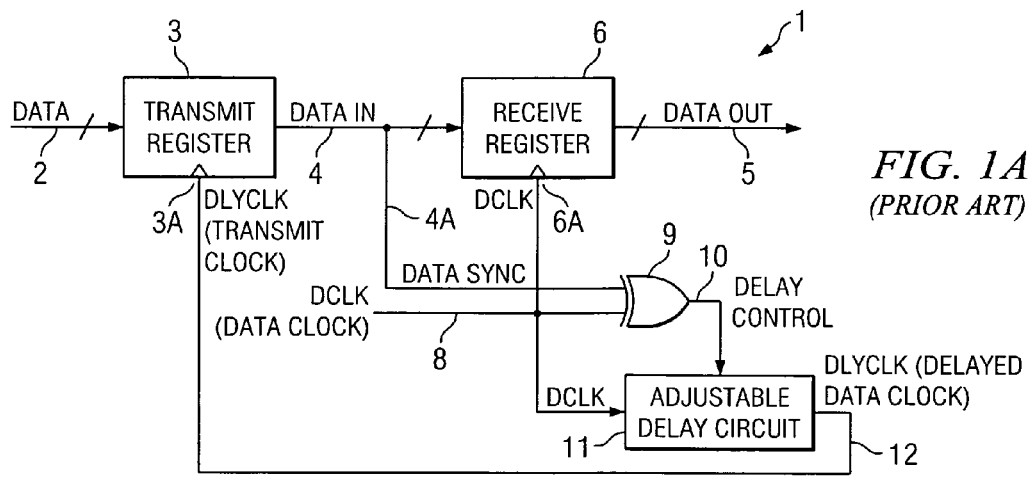
FIG. 1A is a block diagram of a conventional system for using double data rate clock signals transmit data from a transmit register to a receive register.
Figure 1B:
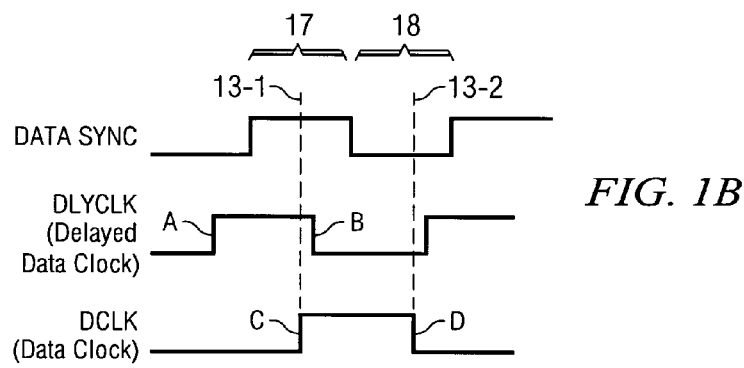
FIG. 1B is a timing diagram showing waveforms useful in explaining operation of the system shown in FIG. 1A.

Data clock signal DCLK and transmit clock signal TRCLK serve as double data rate signals, generally as explained above with reference to the timing diagram of FIG. 1B and require a 50% duty cycle. That is, the various "1"s and "0"s of DATA on bus 2 are clocked into transmit register 3 by a rising edge of TRCLK and then appear on multiconductor bus 4 at the beginning of frame 17 of DATA SYNC. During the next falling edge of TRCLK, the various "1"s and "0"s of DATA on bus 2 are clocked into transmit register 3 and then appear on multiconductor bus 4 at the beginning of frame 18. Similarly, the various "1"s and "0"s of DATA IN on multiconductor bus 4 are clocked into receive register 6 by the next rising edge of data clock DCLK and then appear on output bus 5, and during the next falling edge of DCLK the various "1"s and "0"s of DATA IN on multiconductor bus 4 during the next data frame 18 are clocked into receive register 6 and then appear on output bus 5.

The feedback of the delay locked loop (formed of exclusive OR gate 9, adjustable delay circuit 11, duty cycle adjust circuit 20, and transmit register 3) forces the edges of DATA SYNC and DCLK to be phase locked and in quadrature. The duty cycle of TRCLK is adjusted to a value of 50% by duty cycle adjust circuit 20. The rising and falling edges of clock signal DCLK on conductor 8 clock successive bits of DATA IN from multi-conductor bus 4 into receive register 6. In order to compensate for various delays associated with transmit register 3 and multiconductor bus 4, the delay locked loop adjusts the delay between data clock DCLK on conductor 8 and transmit clock TRCLK produced on conductor 12A until data clock DCLK and the data synchronization signal DATA SYNC are in "quadrature", i.e. 90 degrees out of phase as shown in the timing diagram of FIG. 1B. Duty cycle adjust circuit 20 establishes the duty cycle, e.g., 50%, of transmit clock TRCLK.

It should be appreciated that integrating circuitry (not shown) in adjustable delay circuit 11 for averaging the signal DELAY CONTROL can be digital or analog. The phase detector output could form a digital word. For example, adjustable delay circuit 11 could include string of identical inverters wherein a digital signal representative of DELAY CONTROL turns various multiplexers on and off, causing the number of inverters that are operatively connected in sequence in the string either to increase or decrease depending on the value of the digital word. Each increment of delay then could be the delay of one corresponding inverter in the string.

An input portion (not shown) of adjustable delay circuit 11 has a significant amount of gain so it can properly respond to loop imbalance represented by the signal DELAY CONTROL so as to produce precisely the amount by which DLYCLK should be delayed relative to DCLK in order to obtain the desired transmit clock signal TRCLK. The gain referred to has to produce very large changes in the delay of adjustable delay circuit 11 in response to small changes in DELAY CONTROL in order to achieve a highly accurate quadrature relationship between DATA SYNC and DCLK.

When adjustable delay circuit 11 receives DELAY CONTROL with an average value that is increased to a level greater than VDD/2, there is a corresponding increase in the amount of delay produced between data clock signal DCLK and delayed data clock signal DLYCLK by adjustable delay circuit 11. Conversely, if adjustable delay circuit 11 receives DELAY CONTROL 12 with an average value decreased to a level less than VDD/2, there is a corresponding decrease in the amount of delay produced between data clock signal DCLK and delayed data clock signal DLYCLK by adjustable delay circuit 11. Thus, when adjustable delay circuit 11 receives a signal having an average value greater than VDD/2, its delay is increased. That increase in delay causes transmit clock TRCLK to be delayed, and that causes DATA IN, and hence DATA SYNC, to be delayed by the same amount.

The feedback loop of the delay locked loop in FIG. 2A adjusts the delay of TRCLK to achieve a condition wherein the amount of time that the logic levels of DATA SYNC and DCLK are equal is precisely equal to the amount of time that the logic levels of DATA SYNC and DCLK are opposite, that condition being the quadrature condition referred to herein.

For very high speed applications, the various signals in the circuit of FIG. 2A preferably are differential signals, but for slower speed applications some or all of the signals could be single ended.

FIG. 2B shows an implementation of duty cycle controller 20 with its input connected to conductor 12 of FIG. 2A and its output connected by conductor 12A to the clock input terminal 3A of transmit register 3. Duty cycle adjust circuit 20 includes a delay circuit 21 which receives the delayed data clock signal DLYCLK on conductor 12. The voltage BIAS CONTROL on conductor 24 establishes the bias current in delay circuit 21. Duty cycle controller 20 produces a duty cycle feedback signal DTYCTRL on conductor 23 which is applied to an input of delay circuit 21. The transmit clock signal TRCLK produced on conductor 12A is also applied to the input of a conventional 3-pole low pass filter 25. The output $V_{AVE}$ of filter 25 is connected by conductor 26 to the (+) input of an operational amplifier 27.

The (−) input of operational amplifier 27 is coupled to a reference voltage Vref which is produced on conductor 30 by a reference voltage divider circuit including resistors 31 and 32 coupled between VDD and ground. If the resistances of resistors 31 and 32 are equal, and if the output voltage of filter 25 can range between VDD and ground, then Vref is equal to VDD/2 and sets the delay of positive and negative "half-cycles" of DLYCLK such that transmit clock TRCLK has a 50% duty cycle. This causes data synchronization signal DATA SYNC to also have a 50% duty cycle. (As subsequently explained with reference to FIG. 3, since a delay adjustment is accomplished by means of transistors 41 and 42 in FIG. 3 between DLYCLK on conductor 12 and a saw-tooth waveform on conductor 46 in FIG. 3 so as to cause the durations of the rising and falling edges of the saw-tooth waveform on conductor 46 to be equal, DLYLK can be considered to have asymmetric positive and negative "half-cycles".)

Figure 3:
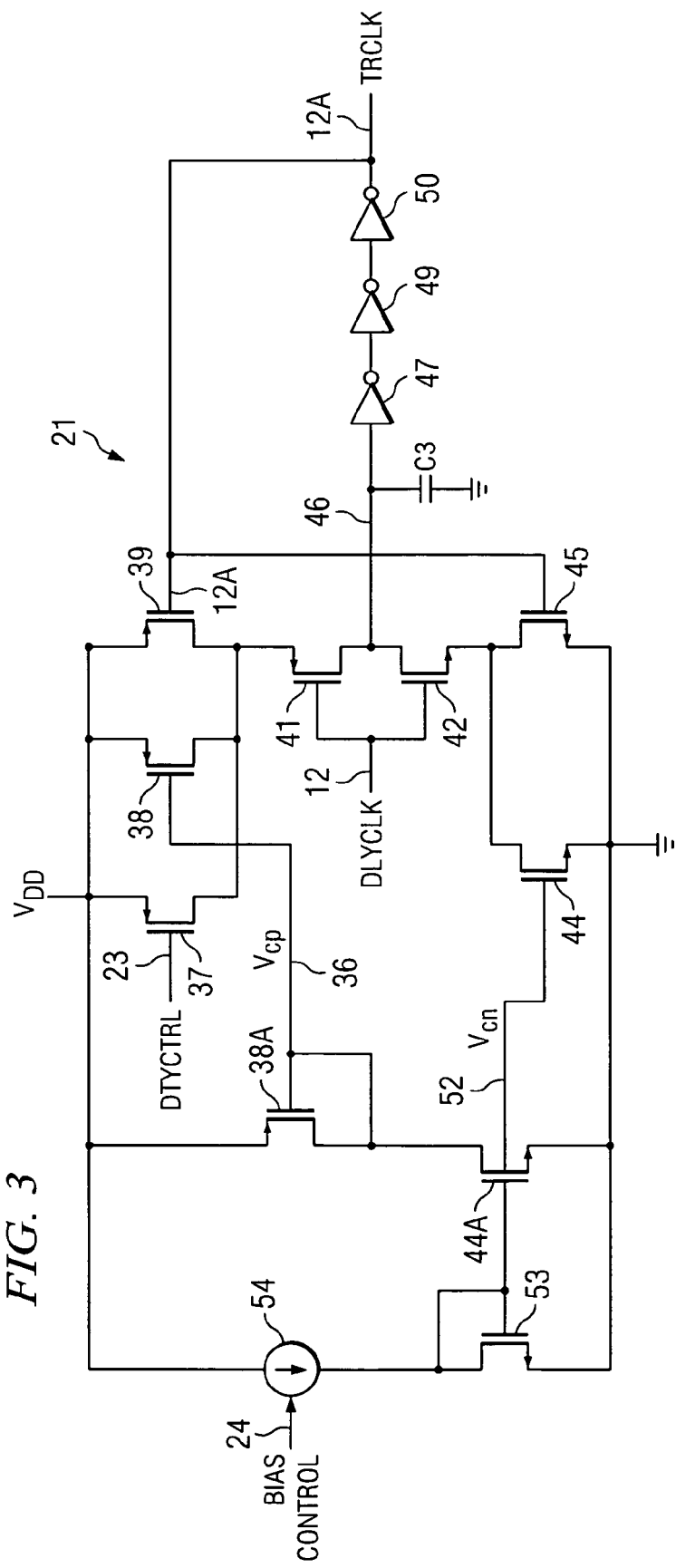
FIG. 3 is a schematic diagram of the delay circuit 21 shown in FIG. 2B.

FIG. 3 shows the circuitry of delay circuit 21 of duty cycle adjust circuit 20. The voltage BIAS CONTROL on conductor 24 sets the current produced by a current source 54 which is connected between VDD and the drain and gate of a N-channel current mirror control transistor 53, the source of which is connected to ground. The gate and drain of current mirror control transistor 53 are connected by conductor 52 to the gate of a N-channel current mirror output transistor 44A, the source of which is connected to ground. A signal Vcn is produced on conductor 52. The drain of current mirror output transistor 44A is connected by conductor 36 to the drain and gate of a P-channel transistor 38A, the source of which is connected to VDD. A voltage Vcp is produced on conductor 36 and applied to the gate of P-channel transistor 38. The sources of P-channel transistors 37, 38 and 39 are connected to VDD.

The drains of transistors 37, 38, and 39 are connected to the source of a P-channel transistor 41, the drain of which is connected by conductor 46 to the drain of a N-channel transistor 42 and to one terminal of a capacitor C3 and the input of a CMOS inverter 47. The gate of transistor 37 receives the duty cycle control feedback signal DTYCTRL produced on conductor 23 by operational amplifier 27 of FIG. 2B. The other terminal of capacitor C3 is connected to ground (or VSS). The gates of transistors 41 and 42 are connected to conductor 12 to receive the delayed clock signal DLYCLK from adjustable delay circuit 11. The source of transistor 42 is connected to the drains of N-channel transistors 44 and 45, the sources of which are connected to ground (or VSS). The gate of transistor 44 is connected by conductor 52 to receive the voltage Vcn. The gate of transistor 45 is connected by conductor 12A to the gate of transistor 39 to receive transmit clock TRCLK.

The output of CMOS inverter 47 is connected to the input of a CMOS inverter 49, the output of which is connected to the input of a CMOS inverter 50. The output of CMOS inverter 50 is connected to conductor 12A on which transmit clock signal TRCLK is produced.

In FIG. 3, current source 54, transistors 44 and 44A, and transistors 38 and 38A conduct fixed currents, with their control electrodes receiving fixed bias voltages. The CMOS inverter 41, 42 is a "current starved" inverter, which controls the charging rate of capacitor C3. The circuitry including transistors 37, 38 and 39 perform a "current starving" or regulating of current supplied to the current starved inverter 41, 42 in response to the duty cycle control voltage DTYCTRL produced by operational amplifier 27 and also in response to transmit clock TRCLK. The current in transistor 44 is set to be equal to the sum of the currents in transistors 37 and 38. The nominal current through transistor 37 is equal to the current through transistor 38. If DTYCTRL is equal to Vcp, then the drain currents of transistors 37 and 38 are equal and their sum is equal to the drain current of transistor 44. If the voltage DTYCTRL varies from Vcp, then the sum of the currents in transistors 37 and 38 increases or decreases depending on the polarity of the change of the variation of DTYCTRL from Vcp. The delay control voltage DTYCTRL varying from Vcp causes the current of transistor 37 to change accordingly, which causes the current in transistor 41 to change accordingly. The changing current in transistor 41 causes the capacitor charge rate of capacitor C3 to be either greater than or less than the constant capacitor discharge rate due to the constant source current of transistor 42. Thus, the delay control voltage DTYCTRL varying from Vcp changes the charging rate of capacitor C3 relative to its discharging rate. This adjusts the duty cycle of the signal on conductor 46.

In response to asymmetric of delay clock DCLK (meaning DCLK has a non-50% duty cycle), the charging rate of capacitor C3 is adjusted asymmetrically so as to compensate and produce a 50% duty cycle of TR CLK. The gains and threshold voltages of CMOS inverters 47, 49, and 50 cause a square wave shape of TRCLK on conductor 12A, with steep and equal rising and falling edges.

To adjust the duty cycle, DTYCTRL turns transistor 37 on more or less strongly in response to the determination of operational amplifier 27 as to how closely matched the output voltage $V_{AVG}$ of filter 25 is to the threshold voltage Vref established by voltage divider 29. If transistor 37 is turned on less strongly by DTYCTRL, the resulting reduced current through transistor 37 charges capacitor C3 more slowly, increasing the duration of the positive half-cycle associated with TRCLK, and conversely, if transistor 37 is turned on more strongly, then it shortens the charging time of capacitor C3 and decreases the duration of the positive half-cycle associated with TRCLK. If DTYCTRL goes lower, that turns P-channel transistor 37 on harder, thereby increasing the rate of charging capacitor C3. This decreases the duration of the positive half-cycle associated with TRCLK.

Transistors 45 and 39 in effect form a CMOS inverter which adds positive feedback current into the sources of transistors 41 and 42 so as to accelerate the charging rate of capacitor C3 after the transition of TRCLK has occurred. Basically, the delay locked loop operates to delay transmit TRCLK so that it clocks DATA IN onto multi-conductor data bus 4 at just the right time so as to allow data clock DCLK to clock DATA IN into receive register with the lowest possibility of digital error.

Low pass filter 25 in FIG. 2B removes any AC components from TRCLK and generates an average DC value $V_{AVG}$ on conductor 26. $V_{AVG}$ accurately represents the duty cycle error which needs to be corrected by delay cycle adjust circuit 20 in order to cause TRCLK to have the duty cycle established by Vref. $V_{AVG}$ is applied to the (+) input of operational amplifier 27, and therefore $V_{AVG}$ is compared to the reference voltage Vref produced by voltage divider resistors 31 and 32 between VDD and ground. If the resistances of resistors 31 and 32 are equal, Vref is equal to VDD/2, which corresponds to a 50% duty cycle of TRCLK. If the filtered output $V_{AVG}$ on conductor 26 in FIG. 2B is not equal to Vref, then operational amplifier 27 adjusts operation so that the duration of the positive half-cycle of TRCLK, as explained above, causes the duty cycle of TRCLK to shift appropriately to cause $V_{AVG}$ to approach VDD/2.

Delay circuit 21 of FIG. 2B thus uses feedback produced by filter 25 and operational amplifier 27 to precisely control the duty cycle of TRCLK. The feedback circuit operates by determining the average value of the output clock waveform TRCLK and comparing it to reference voltage Vref. The signal BIAS CONTROL on conductor 24 controls the current source 54 which in turn controls the bias current of delay circuit 21. Thus the duty cycle is set to be Duty Cycle (%)=Vref/(VDD−VSS(or ground))*100.

The circuit provides the advantage that the duty cycle of the clock is not sensitive to changes in process parameters and temperature. Also, the duty cycle of the input data clock DCLK need not be equal to the duty cycle of the output clock TRCLK.

Figure 4:
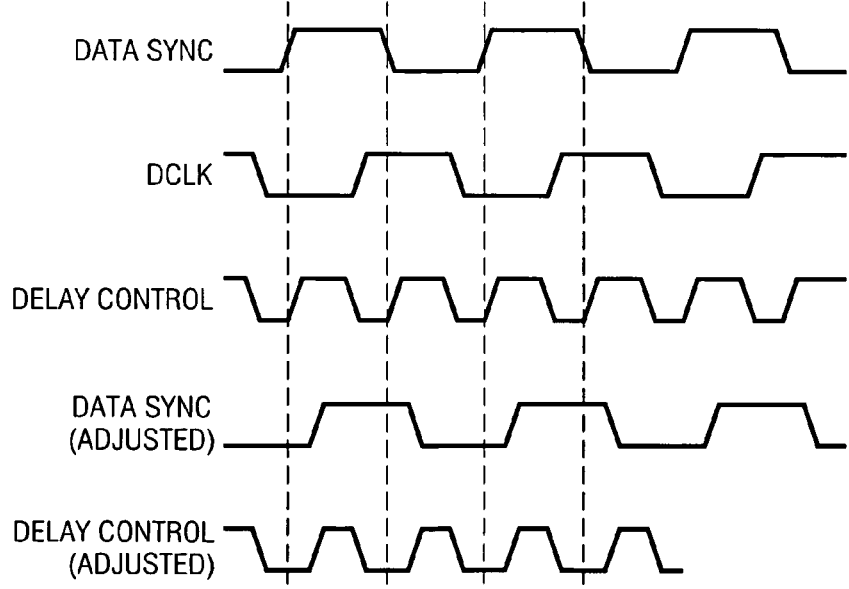
FIG. 4 is a timing diagram useful in explaining operation of the circuit in FIG. 2A.

The waveforms in the timing diagram shown in FIG. 4 are useful in understanding how the feedback loop in FIG. 2A operates to force the two inputs DATA SYNC and DCLK to exclusive OR gate 9 to be synchronized and in quadrature relative to each other. Exclusive OR gate 9 causes the signal DELAY CONTROL on conductor 10 to be at a "1" level if DATA SYNC and DCLK are at different logic levels, and otherwise produces a "0" level on conductor 10. If DATA SYNC and DCLK both have a 50% duty cycle, then the feedback loop causes them to be 90 degrees out of phase, i.e., in quadrature.

The waveforms of DATA SYNC and DCLK as illustrated in FIG. 4 each have a 50% duty cycle. The synchronization signal DATA SYNC on conductor 4A precisely represents the timing of the parallel digital signal DATA IN on multi-conductor bus 4. Exclusive OR gate 9 is at a low or "0" level whenever DATA SYNC and DCLK are at the same logic level and is at a high or "1" level when they are at different logic levels.

In FIG. 4, DATA SYNC and DCLK are illustrated as initially being at different logic levels most of the time, and clearly are not 90 degrees apart in phase, i.e., are not in quadrature. The delay produced by adjustable delay circuit 11 is proportional to the average value of the output signal DELAY CONTROL produced by exclusive OR circuit 9. For DATA SYNC and DCLK as illustrated in FIG. 4, the delay of DATA SYNC needs to be increased, so a higher average value of DELAY CONTROL produces more delay of delayed clock signal DLYCLK relative to clock signal DCLK.

In FIG. 4, DATA SYNC is adjusted by being shifted to the right until the output of exclusive OR circuit 9 is at a 50% duty cycle at twice the frequency of the data clock DCLK. That results in exclusive OR gate 9 producing the signal DELAY CONTROL(ADJUSTED) on conductor 10.

It should be appreciated that there may be some applications in which the desired duty cycle is different than 50%, although probably not if it is desired to maintain a quadrature relationship of DATA IN and DCLK. For a particular clock frequency and delay circuit 21, a wide range of duty cycles is available. The feedback loop can control multiple cascaded delay elements to provide large delays and large delay sensitivity without compromising the accuracy of the duty cycle control. It should be appreciated that the circuit shown in FIG. 2A can be used to correct any clock signal having an erroneous duty cycle.

Very precise duty cycles of 50% can be obtained at very high data rates of several gigahertz or more without the need to divide down a higher frequency clock. Furthermore, multiple delay cells can be connected in cascade to obtain larger delays and higher delay sensitivity without multiplying the error in the duty cycle.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, in some cases TRCLK might be an analog signal rather than a digital signal.

What is claimed is:

1. A circuitry for establishing and automatically maintaining a predetermined duty cycle of a control signal, comprising:
   (a) a phase detector having a first input coupled to receive a data clock signal and a second input coupled to a synchronization conductor to receive a data synchronization signal, the phase detector producing a delay control signal having a value indicative of a phase difference between the data clock signal and the data synchronization signal;
   (b) a first delay circuit for producing a first delayed signal which is delayed relative to the data clock signal by an amount corresponding to a value of the delay control signal; and (c) a second delay circuit having an input receiving the first delayed signal and also having an output for producing the control signal by delaying the first delayed signal an amount which causes the control signal to have a predetermined duty cycle;

wherein at least one delay circuit includes at least one of a current starved inverter circuitry that charges and discharges a capacitance to produce a saw-tooth signal having positive-going and negative-going half, or includes circuitry responsive to the duty cycle of the control signal for adjusting at least one of charging rate of capacitance or adjusting the duty cycle of the control signal.

2. The circuitry for establishing and automatically maintaining a predetermined duty cycle of the control signal as recited in claim 1 wherein the control signal is a clock signal.

3. The circuitry for establishing and automatically maintaining a predetermined duty cycle of the control signal as recited in claim 1 wherein the control signal is a digital signal.

4. The circuitry for establishing and automatically maintaining a predetermined duty cycle of the control signal as recited in claim 1 wherein a delay locked loop adjusts the delay of the first delayed signal to achieve a condition wherein amounts of time that the logic levels of the data synchronization signal and the data clock signal are equal is precisely equal to amounts of time that the logic levels of the data synchronization signal and the data clock signal are opposite.

5. The circuitry for establishing and automatically maintaining a predetermined duty cycle of the control signal as recited in claim 1 wherein the first delay circuit delays the first delayed signal by an amount corresponding to an average value of the delay control signal.

6. The circuitry for establishing and automatically maintaining a predetermined duty cycle of the control signal as recited in claim 1 wherein the phase detector operates to determine when the data clock signal and the data synchronization signal are at different logic levels.

7. The circuitry for establishing and automatically maintaining a predetermined duty cycle of the control signal as recited in claim 6 wherein the phase detector includes an exclusive ORing circuit which produces the delay control signal as a first logic level if the data clock signal and the data synchronization signal are at different logic levels and produces the delay control signal as a second logic level if the data clock signal and the data synchronization signal are at the same logic level.

8. The circuitry for establishing and automatically maintaining a predetermined duty cycle of the control signal as recited in claim 1 including a first storage element having a data input, a control input, a data output coupled to a first data bus, and a synchronization conductor conducting the data synchronization signal in synchronization with data on the first data bus.

9. The circuitry for establishing and automatically maintaining a predetermined duty cycle of the control signal as recited in claim 8 wherein the first data bus is a parallel data bus and wherein a sufficient portion of the synchronization conductor is physically grouped with other conductors of the first data bus to ensure that the data synchronization signal is precisely synchronized with the data appearing at the input of a second storage element.

10. The circuitry for establishing and automatically maintaining a predetermined duty cycle of the control signal as recited in claim 8 including a second storage element having a data input coupled to the first data bus, a clock input coupled to the data clock signal, and a data output coupled to a second data bus.

11. The circuitry for establishing and automatically previously a predetermined duty cycle of the control signal as recited in claim 8 wherein the second delay circuit introduces a delay which causes a delay locked loop including the phase detector, the first delay circuit, the second delay circuit, and the first storage element to cause the control signal to have a 50% duty cycle.

12. The circuitry for establishing and automatically maintaining a predetermined duty cycle of the control signal as recited in claim 11 wherein the second delay circuit includes a third delay circuit having a first input coupled to receive the first delayed signal, a second input, and an output coupled to the output of the second delay circuit, a filter coupled to filter the control signal and produce an output signal which represents an average value of the control signal, and an operational amplifier having a first input coupled to receive the average value of the control signal, a reference voltage circuit producing a reference voltage on a second input of the operational amplifier, an output of the operational amplifier producing a duty cycle control signal on the second input of the third delay circuit.

13. The circuitry for establishing and automatically maintaining a predetermined duty cycle of the control signal as recited in claim 12 wherein the filter is a 3 pole low pass filter.

14. The circuitry for establishing and automatically maintaining a predetermined duty cycle of the control signal as recited in claim 8 wherein the control signal is a double data rate signal which clocks successive bits of data into the first storage element in response to rising edges and in response to falling edges, respectively, of the control signal.

15. The circuitry for establishing and automatically maintaining a predetermined duty cycle of the control signal as recited in claim 14 wherein the data clock signal and the data synchronization signal are double data rate signals.

16. Circuitry for establishing and automatically maintaining a predetermined duty cycle of the control signal, comprising:

(a) means for providing a data clock signal on a first input of a phase detector circuit and applying a data synchronization signal to a second input of the phase detector circuit and operating the phase detector circuit to produce a delay control signal having a value indicative of a phase difference between the data clock signal and the data synchronization signal;

(b) means for producing a delayed clock signal by delaying the data clock signal in response to the delay control signal; and (c) means for producing the control signal by delaying the first delayed signal an amount which causes the control signal to have a predetermined duty cycle, wherein at least one delay circuit includes at least one of a current starved inverter circuitry that charges and discharges a capacitance to produce a saw-tooth signal having positive-going and negative-going half, or includes circuitry responsive to the duty cycle of the control signal for adjusting at least one of charging rate of capacitance or adjusting the duty cycle of the control signal.

17. A method of establishing and automatically maintaining a predetermined duty cycle of a control signal, the method comprising:

(a) providing a data clock signal on a first input of a phase detector circuit and applying a data synchronization signal to a second input of the phase detector circuit and operating the phase detector circuit to produce a delay control signal having a value indicative of a phase difference between the data clock signal and the data synchronization signal;
(b) producing a delayed clock signal by delaying the data clock signal in response to the delay control signal; and
(c) producing the control signal by delaying the first delayed signal an amount which causes the control signal to have a predetermined duty cycle, wherein at least one delay circuit includes at least one of a current starved inverter circuitry that charges and discharges a capacitance to produce a saw-tooth signal having positive-going and negative-going half, or includes circuitry responsive to the duty cycle of the control signal for adjusting at least one of charging rate of capacitance or adjusting the duty cycle of the control signal.

18. The method of claim 17 wherein step (c) includes producing the first delayed signal so it is delayed relative to the data clock signal by an amount corresponding to an average value of the delay control signal.

19. The method of claim 18 wherein step (b) includes integrating the delay control signal to produce the average value.

* * * * *